(12) United States Patent
Kogawa

(10) Patent No.: US 11,178,770 B2
(45) Date of Patent: Nov. 16, 2021

(54) SEMICONDUCTOR DEVICE AND SEMICONDUCTOR DEVICE MANUFACTURING METHOD

(71) Applicant: FUJI ELECTRIC CO., LTD., Kawasaki (JP)

(72) Inventor: Hiroki Kogawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/084,435

(22) Filed: Oct. 29, 2020

(65) Prior Publication Data

US 2021/0176863 A1 Jun. 10, 2021

(30) Foreign Application Priority Data

Dec. 6, 2019 (JP) .............................. JP2019-221210

(51) Int. Cl.
*H05K 3/10* (2006.01)
*H05K 1/18* (2006.01)
*H05K 1/03* (2006.01)

(52) U.S. Cl.
CPC ........... *H05K 1/181* (2013.01); *H05K 1/0306* (2013.01); *H05K 3/102* (2013.01); *H05K 2201/0209* (2013.01)

(58) Field of Classification Search
CPC ...... H05K 1/181; H05K 3/102; H05K 1/0306; H05K 2201/0209
USPC ...................................................... 361/760
See application file for complete search history.

(56) References Cited

U.S. PATENT DOCUMENTS

| 6,522,555 | B2 * | 2/2003 | Hirano | ................ H01L 23/3737 |
| | | | | 174/51 |
| 2010/0091464 | A1 * | 4/2010 | Ohnishi | .............. H01L 23/3735 |
| | | | | 361/723 |
| 2014/0210060 | A1 | 7/2014 | Nakamata et al. | |
| 2015/0130085 | A1 * | 5/2015 | Hino | ....................... H01L 24/83 |
| | | | | 257/782 |
| 2015/0187671 | A1 * | 7/2015 | Fukuda | ............. H01L 23/49541 |
| | | | | 257/773 |
| 2015/0380274 | A1 * | 12/2015 | Yoshimatsu | ........ H01L 23/3121 |
| | | | | 438/126 |
| 2016/0086870 | A1 * | 3/2016 | Abe | ...................... H01L 23/367 |
| | | | | 257/712 |
| 2016/0315023 | A1 * | 10/2016 | Yoshida | ............... H05K 1/0209 |
| 2018/0005920 | A1 | 1/2018 | Kajihara et al. | |
| 2018/0096937 | A1 * | 4/2018 | Saegusa | .................. H01L 23/24 |

(Continued)

FOREIGN PATENT DOCUMENTS

JP H10-173097 A 6/1998
JP H11-354662 A 12/1999

(Continued)

*Primary Examiner* — Sherman Ng
(74) *Attorney, Agent, or Firm* — Rabin & Berdo, P.,C.

(57) ABSTRACT

A semiconductor device, including an insulated circuit board that has a radiation plate, a resin board adhered to a front surface of the radiation plate, and a circuit pattern adhered to a front surface of the resin board. The resin board contains a resin. The semiconductor device further includes a wiring member, and at least one semiconductor chip, bonded to the front surface of the circuit pattern or electrically connected to the wiring member. The circuit pattern has at least one pair of side portions opposite to each other that are supported by the resin board.

15 Claims, 15 Drawing Sheets

(56) References Cited

U.S. PATENT DOCUMENTS

2018/0226324 A1* 8/2018 Kimura ................ H01L 23/049
2019/0103334 A1* 4/2019 Tanaka ................ H01L 23/293

FOREIGN PATENT DOCUMENTS

| JP | 2014-146704 A | 8/2014 |
|----|---------------|---------|
| WO | 2016/166835 A1 | 10/2016 |

* cited by examiner

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2019-221210, filed on Dec. 6, 2019, the entire contents of which are incorporated herein by reference.

BACKGROUND OF THE INVENTION

1. Field of the Invention

The embodiment discussed herein relates to a semiconductor device and a semiconductor device manufacturing method.

2. Background of the Related Art

Semiconductor devices include a semiconductor chip and a control integrated circuit (IC). A switching element which is a power device is used as the semiconductor chip. The switching element is an insulated gate bipolar transistor (IGBT), a power metal oxide semiconductor field effect transistor (MOSFET), or the like. The control IC exercises drive control of the semiconductor chip. Such semiconductor devices include a substrate over which the semiconductor chip is located, a case which houses the substrate, and sealing resin which seals the inside of the case. Wiring members and control terminals are insert-molded with the case. The wiring members and main electrodes of the semiconductor chip are electrically connected by bonding wires. Furthermore, the control terminals and the control IC are electrically connected by bonding wires.

Japanese Laid-open Patent Publication No. 2014-146704

However, the following processes are performed in order to produce the above semiconductor devices. First a molding process is performed for integrally molding the case and the wiring members and the control terminals. Furthermore, a bonding process is performed for bonding the substrate to the case. In addition, a bonding process is performed for electrically connecting a circuit pattern over which the semiconductor chip is placed and the wiring members integrally molded with the case by the bonding wires. Many processes and members are needed in this way in order to produce the above semiconductor devices. This leads to high production costs. In particular, the bonding process takes time for the following reason. A current amount increases with an increase in the power capacity of a semiconductor device. Accordingly, there is a need to increase the number of bonding wires. As a result, a bonding process takes time compared with the bonding processes of conventional semiconductor devices.

SUMMARY OF THE INVENTION

According to an aspect, there is provided a semiconductor device including an insulated circuit board, having a radiation plate having a front surface, a resin board having a front surface and a back surface that is adhered to the front surface of the radiation plate, the resin board containing a resin, and a circuit pattern having a front surface and a back surface that is adhered to the front surface of the resin board; a wiring member; and at least one semiconductor chip, bonded to the front surface of the circuit pattern or electrically connected to the wiring member, wherein the circuit pattern has at least one pair of side portions opposite to each other that are supported by the resin board.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described by reference to the accompanying drawings. In the following description a "front surface" or an "upper surface" indicates a surface of a semiconductor device 10 of FIG. 2 which faces upward.

Figure 2:
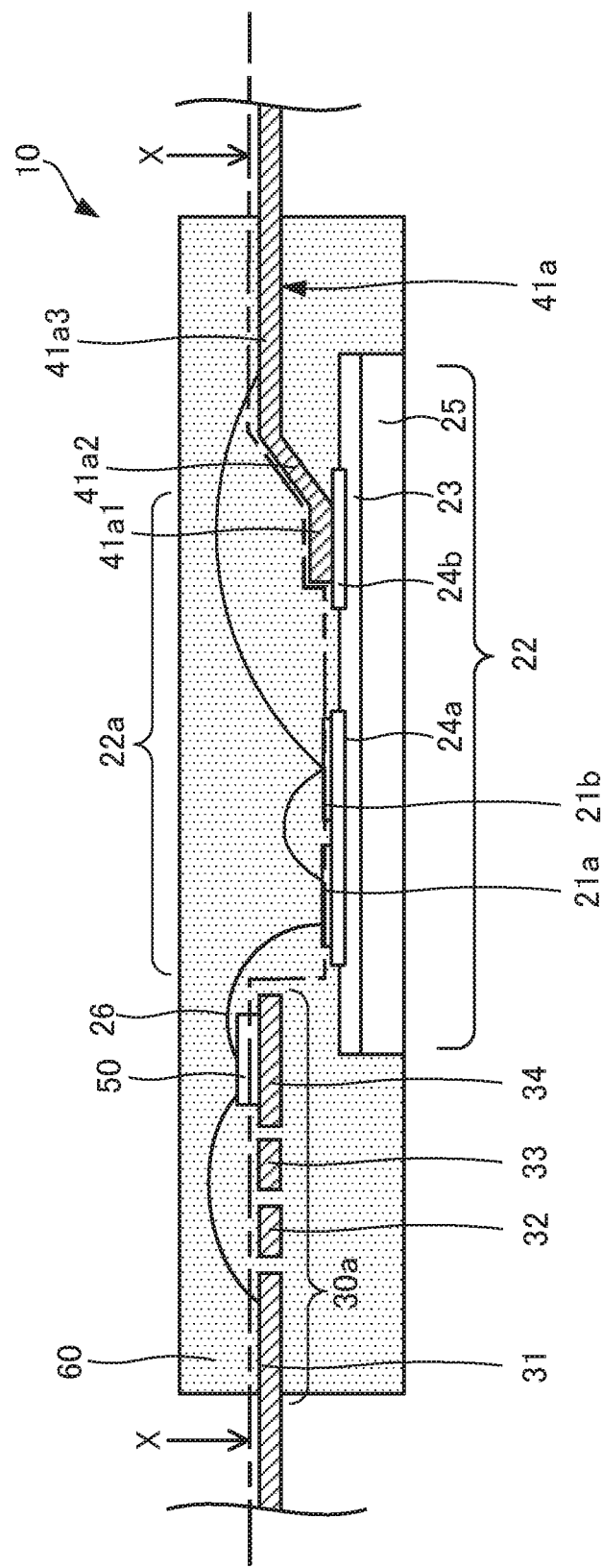
FIG. 2 is a sectional side elevation view of the semiconductor device according to the embodiment.

Similarly, an "upside" indicates the upper side of the semiconductor device 10 of FIG. 2. A "back surface" or a "lower surface" indicates a surface of the semiconductor device 10 of FIG. 2 which faces downward. Similarly, a "downside" indicates the lower side of the semiconductor device 10 of FIG. 2. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction.

Figure 1A:
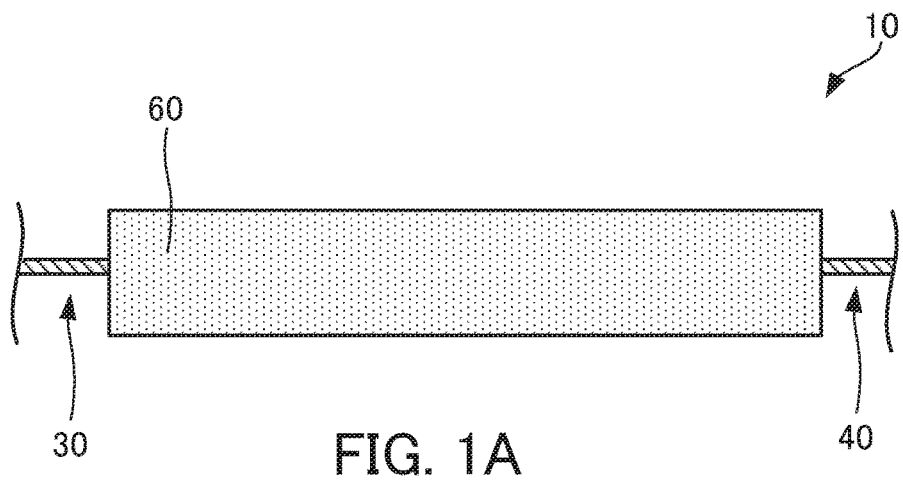
FIGS. 1A and 1B are views for describing the external appearance of a semiconductor device according to an embodiment.
Figure 1B:
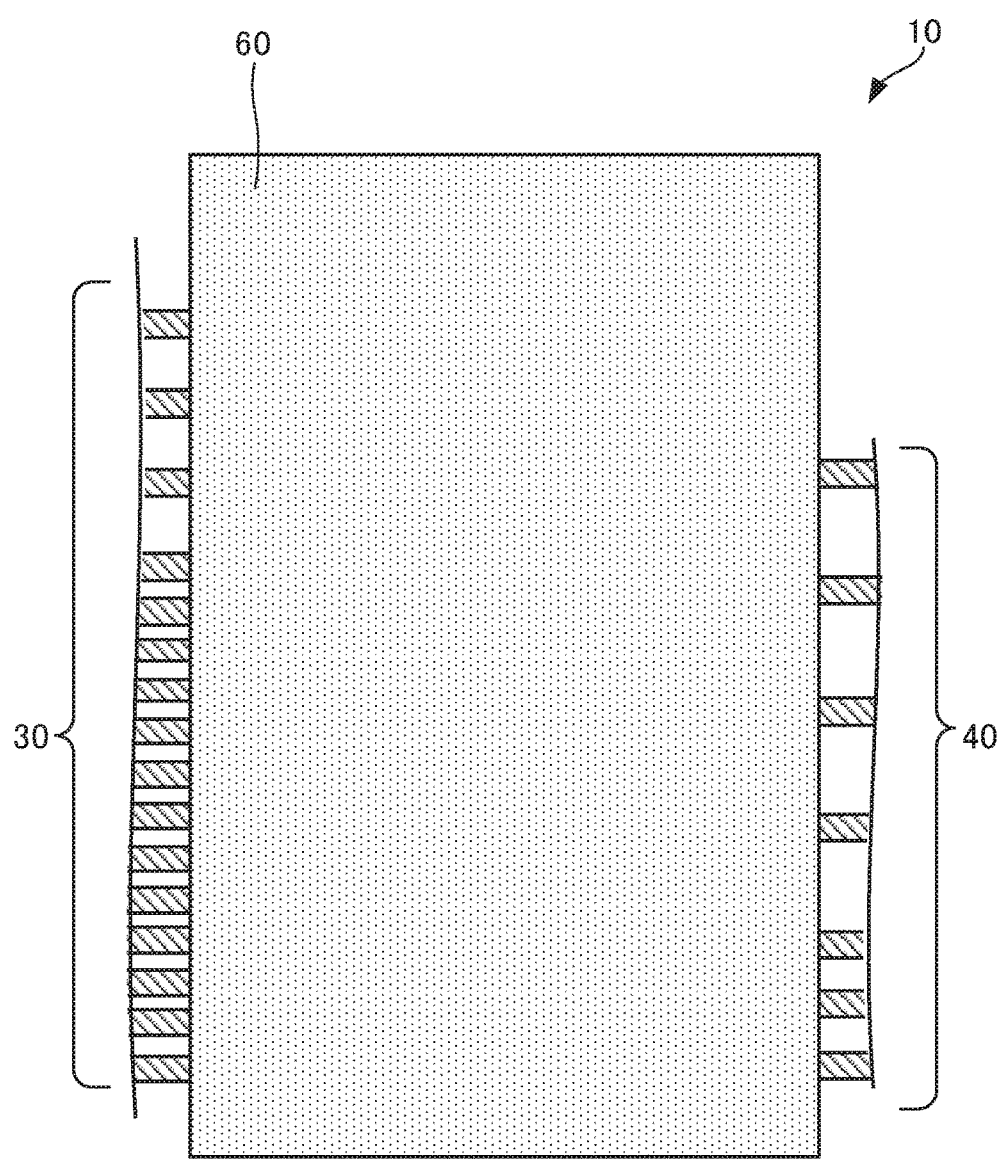
Figure 3:
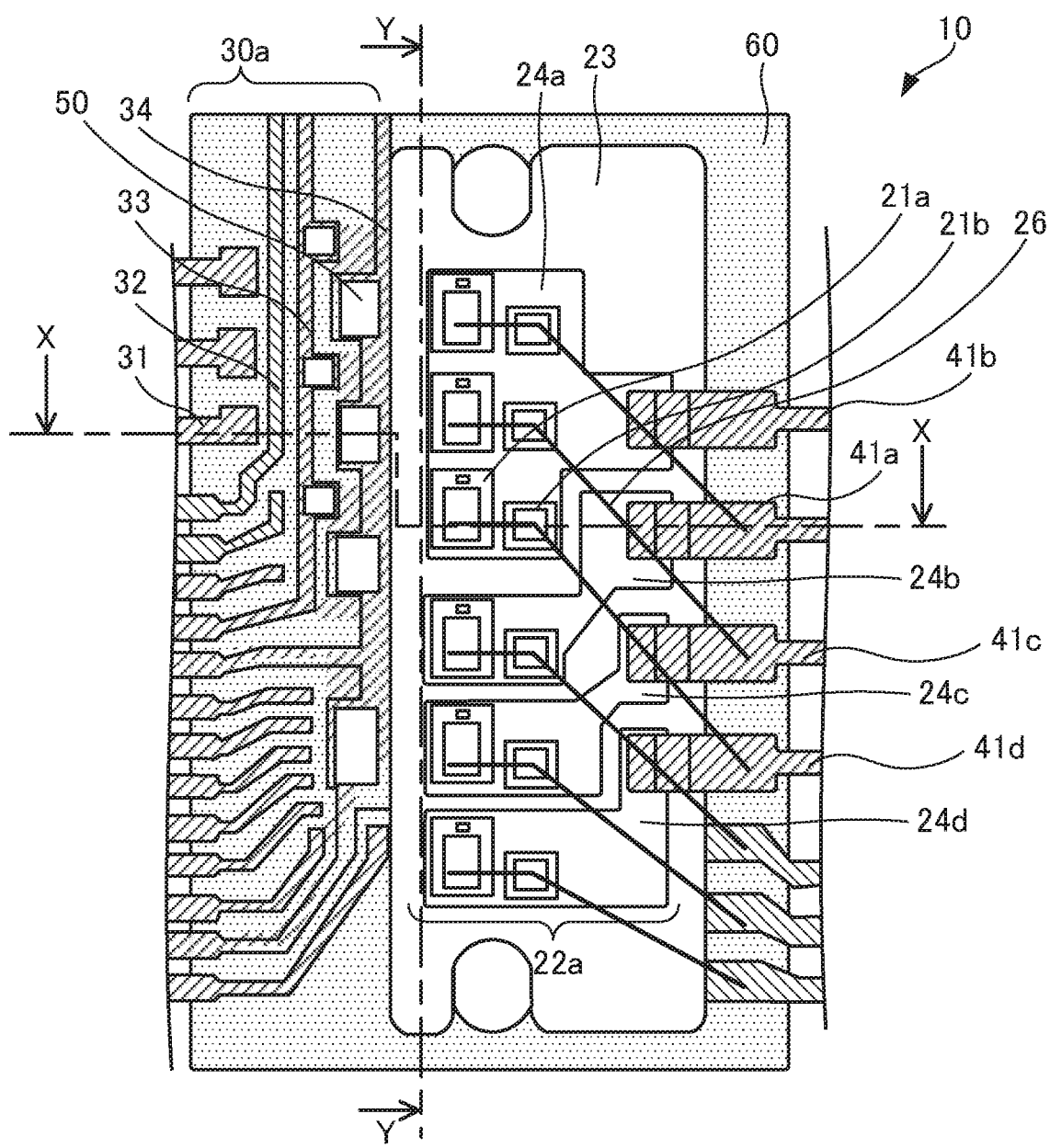
FIG. 3 is a plan sectional view of the semiconductor device according to the embodiment.

A semiconductor device according to an embodiment will be described by the use of FIGS. 1 through 3. FIGS. 1A and 1B are views for describing the external appearance of the semiconductor device according to the embodiment. FIG. 1A is a side view of the semiconductor device 10 (viewed from the upside or the downside of FIG. 1B). FIG. 1B is a plan view of the semiconductor device 10. FIG. 2 is a sectional side elevation view of the semiconductor device according to the embodiment. Furthermore, FIG. 3 is a plan sectional view of the semiconductor device according to the embodiment. FIG. 2 is a sectional view taken along the dot-dash line X-X of FIG. 3. FIG. 3 is a sectional view taken along the dot-dash line X-X of FIG. 2. Furthermore, FIG. 3 corresponds to the plan view of FIG. 1B.

First, as illustrated in FIGS. 1A and 1B, all of the parts of the semiconductor device 10 are sealed with a sealing member 60 and the semiconductor device 10 has a solid shape. The sealing member 60 of the semiconductor device 10 has a solid shape. However, each corner portion of the sealing member 60 may have curvature. Furthermore, with the semiconductor device 10 a plurality of control terminals 30 extend from one side on the long side of the sealing member 60 and a plurality of external connection terminals 40 extend from the other side on the long side of the sealing member 60. In this embodiment description will be given as the control terminals 30 or the external connection terminals 40 if no special distinction is made between them.

With the semiconductor device 10 the parts illustrated in FIGS. 2 and 3 are sealed with the sealing member 60. That is to say, the semiconductor device 10 includes six sets of a first semiconductor chip 21a and a second semiconductor chip 21b, an insulated circuit board 22, the control terminals 30 (including control terminals through 33), the external connection terminals 40 (including external connection terminals 41a through 41d), and electronic parts 50. Furthermore, with the semiconductor device 10 an electrical connection is properly made by bonding wires 26 between the control terminals 30, the electronic parts 50, the first semiconductor chips 21a, the second semiconductor chips 21b, and the external connection terminals 40. In FIG. 3, bonding wires connected to the electronic parts 50 are not illustrated. With the semiconductor device 10 these parts are sealed with the sealing member 60. The bonding wires 26 are made of metal, such as aluminum or copper, an alloy containing at least one of them, or the like having good electrical conductivity. In addition, the diameter of the bonding wires 26 is preferably greater than or equal to 100 μm and smaller than or equal to 1 mm.

A first semiconductor chip 21a includes a switching element such as an IGBT or a power MOSFET. If the first semiconductor chip 21a includes an IGBT, then it has a collector electrode as a main electrode on the back surface and has a gate electrode and an emitter electrode as a main electrode on the front surface. If the first semiconductor chip 21a includes a power MOSFET, then it has a drain electrode as a main electrode on the back surface and has a gate electrode and a source electrode as a main electrode on the front surface. The back surfaces of the above first semiconductor chips 21a are bonded to circuit patterns 24a, 24b, 24c, and 24d of the insulated circuit board 22 with solder (not illustrated). A second semiconductor chip 21b includes a freewheeling diode (FWD) such as a Schottky barrier diode (SBD) or a P-intrinsic-N (PiN) diode. Such a second semiconductor chip 21b has an output electrode (cathode electrode) as a main electrode on the back surface and has an input electrode (anode electrode) as a main electrode on the front surface. The back surfaces of the above second semiconductor chips 21b are bonded to the circuit patterns 24a, 24b, 24c, and 24d with solder (not illustrated). A reverse-conducting (RC)-IGBT having the function of an IGBT and the function of an FWD may be used in place of the first semiconductor chip 21a and the second semiconductor chip 21b. Moreover, FIG. 3 simply illustrates a case where the six sets of a first semiconductor chip 21a and a second semiconductor chip 21b are included. However, the number of sets of a first semiconductor chip 21a and a second semiconductor chip 21b is not limited to six. Sets of a first semiconductor chip 21a and a second semiconductor chip 21b corresponding to the specifications and the like of the semiconductor device 10 may be included.

The insulated circuit board 22 includes a resin board 23, the circuit patterns 24a, 24b, 24c, and 24d, and a radiation plate 25. The resin board 23 contains epoxy resin, polyimide, or polytetrafluoroethylene. Furthermore, the resin board 23 may contain an inorganic filler in addition to the above resin. The thickness of the resin board 23 is preferably greater than or equal to 0.09 mm and smaller than or equal to 0.15 mm.

The circuit patterns 24a, 24b, 24c, and 24d are formed over the front surface of the resin board 23. At least a pair of side portions opposite each other of each of the circuit patterns 24a, 24b, 24c, and 24d are supported by the resin board 23. The details of the formation of the circuit patterns 24a, 24b, 24c, and 24d over the front surface of the resin board 23 will be described later. The circuit patterns 24a, 24b, 24c, and 24d are made of metal, such as copper or a copper alloy, having good electrical conductivity. The shape of the circuit patterns 24a, 24b, 24c, and 24d illustrated in FIGS. 2 and 3 is an example. The circuit patterns 24a, 24b, 24c, and 24d are formed by etching a conductive plate or foil formed over the front surface of the resin board 23. Alternatively, the circuit patterns 24a, 24b, 24c, and 24d are formed by sticking conductive plates on the front surface of the resin board 23. The thickness of the circuit patterns 24a, 24b, 24c, and 24d is preferably greater than or equal to 0.10 mm and smaller than or equal to 1.00 mm. Furthermore, the thickness of the circuit patterns 24a, 24b, 24c, and 24d is more preferably greater than or equal to 0.20 mm and smaller than or equal to 0.50 mm. In addition, as illustrated in FIGS. 2 and 3, the circuit patterns 24a, 24b, 24c, and 24d are formed in an element region 22a of the principal plane of the insulated circuit board 22. The first semiconductor chips 21a and the second semiconductor chips 21b are bonded to the circuit patterns 24a, 24b, 24c, and 24d with the solder (not illustrated). The shape, arrangement positions, or number of the circuit patterns 24a, 24b, 24c, and 24d or the arrangement positions of the first semiconductor chips 21a or the second semiconductor chips 21b are examples and are not limited to the examples of FIGS. 2 and 3. The shape, arrangement positions, or number of the circuit patterns 24a, 24b, 24c, and 24d or the arrangement positions of the first semiconductor chips 21a or the second semiconductor chips 21b are properly set according to design, specifications, or the like. The following description may be given as the circuit patterns 24 if no special distinction is made between the circuit patterns 24a, 24b, 24c, and 24d.

The radiation plate 25 is formed on the back surface of the resin board 23. The radiation plate 25 is made of metal, such as aluminum, iron, silver, copper, or an alloy containing at least one of them, having high thermal conductivity. In addition, in order to improve corrosion resistance, a material, such as nickel, may be formed on the surface of the radiation plate 25 by plating treatment or the like. A nickel-phosphorus alloy, a nickel-boron alloy, or the like may be used in place of nickel. Furthermore, a cooler (not illustrated) may be fixed to the back surface of the radiation plate 25 with solder, silver solder, or the like therebetween. This further improves the heat dissipation property of the semiconductor device 10. This cooler is made of metal, such as aluminum, iron, silver, copper, or an alloy containing at least one of them, having high thermal conductivity. Moreover, a fin, a heat sink made up of a plurality of fins, a water-cooling cooler, or the like may be used as the cooler. In addition, the radiation plate 25 and the cooler may be integrally formed. In this case, the radiation plate 25 and the cooler are also made of the above metal having high thermal conductivity. Furthermore, a material for improving corrosion resistance may be formed on the surface of the cooler in the same way that is described above. The thickness of the radiation plate is preferably greater than or equal to 0.1 mm and smaller than or equal to 2.0 mm.

The plurality of external connection terminals 40 are wiring members. One end portion of each external connection terminal 40 is located on the right side of the insulated circuit board 22 in FIG. 3 and the other end portion extends from the right side of the semiconductor device 10 to the outside in FIG. 3. The external connection terminals 41b, 41a, 41c, and 41d of the plurality of external connection terminals 40 are bonded to the circuit patterns 24a, 24b, 24c, and 24d, respectively, of the insulated circuit board 22. Furthermore, the external connection terminal 41a includes a bonding portion 41a1, a connecting portion 41a2, and a terminal portion 41a3. The bonding portion 41a1 is parallel to the front surface of the insulated circuit board 22 and is bonded to the circuit pattern 24b. The connecting portion 41a2 is inclined and integrally connects the bonding portion 41a1 and the terminal portion 41a3. The terminal portion 41a3 is separated from the front surface of the insulated circuit board 22 according to the inclination of the connecting portion 41a2 and extends from the insulated circuit board 22 to the outside in parallel with the front surface of the insulated circuit board 22. The structure of the external connection terminals 41b, 41c, and 41d is the same as that of the external connection terminal 41a (not illustrated). Wiring members are not limited to the external connection terminals 40. Wiring members electrically connect the parts in the semiconductor device 10. For example, wiring members connect the first semiconductor chips 21a and the second semiconductor chips 21b and the circuit patterns 24a, 24b, 24c, and 24d. Furthermore, wiring members connect the circuit patterns 24a, 24b, 24c, and 24d. In addition, wiring members electrically connect the circuit patterns 24a, 24b, 24c, and 24d and the external connection terminals 40. Such wiring members are lead frames, bonding ribbons, or bonding wires.

The plurality of control terminals 30 (including the control terminals 31, 32, and 33) are located in a control region 30a of the sealing member 60. The control region 30a is adjacent to the other side portion opposite one side portion through which the plurality of external connection terminals 40 bonded to the insulated circuit board 22 extend. The control region 30a is situated above the front surface of the insulated circuit board 22. The control terminals 30 extend from the left side of the semiconductor device 10 to the outside in FIG. 3. Furthermore, the plurality of control terminals 30 include a control wiring portion 34. The control wiring portion 34 is located in the control region 30a. In addition, the electronic parts 50 are located over the control wiring portion 34 with solder (not illustrated) therebetween. The control wiring portion 34 and a portion of each control terminal 30 extending from the side to the outside are flush with each other. The control wiring portion 34 is situated above the portions of the external connection terminals 40 bonded to the circuit patterns 24a, 24b, 24c, and 24d. Moreover, the control terminals 30 and the terminal portions 41a3, 41b3, 41c3, and 41c4 (terminal portions 41b3, 41c3, and 41c4 are not illustrated) of the external connection terminals 41a, 41b, 41c, and 41d are flush with each other.

The plurality of external connection terminals and the plurality of control terminals 30 (including the control terminals 31, 32, and 33) are made of metal, such as copper or a copper alloy, having good electrical conductivity. Furthermore, the surfaces of the plurality of external connection terminals 40 and the plurality of control terminals 30 (including the control terminals 31, 32, and 33) may be coated with metal such as nickel or a nickel alloy.

The electronic parts 50 are bonded to the control wiring portion 34 with solder (not illustrated) therebetween. The number of the electronic parts 50 depends on whether the semiconductor device 10 is able to carry out a desired function. Furthermore, in order to carry out such a function, a control IC, a thermistor, a capacitor, a resistor, and the like are properly used as the electronic parts 50. The sealing member 60 seals the above parts. The sealing member 60 contains a thermosetting resin, such as epoxy resin, phenolic resin, or maleimide resin, and a filler contained in a thermosetting resin. Epoxy resin containing a filler is an example of the sealing member 60. An inorganic filler is used as the filler. Silicon oxide, aluminum oxide, boron nitride, or aluminum nitride is an example of an inorganic filler.

Figure 4:
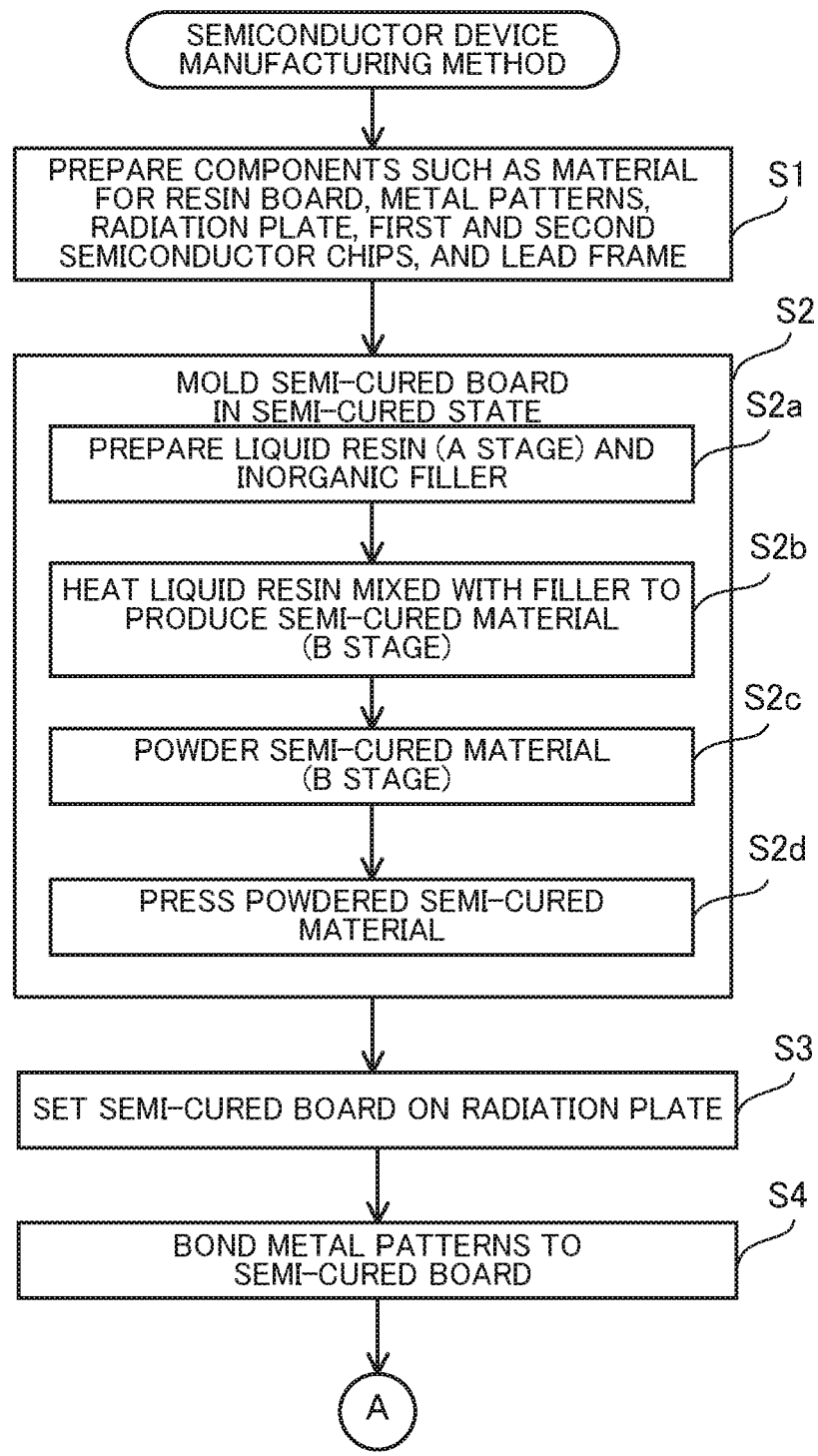
FIG. 4 is a flow chart illustrative of a method for manufacturing the semiconductor device according to the embodiment (part 1)
Figure 5:
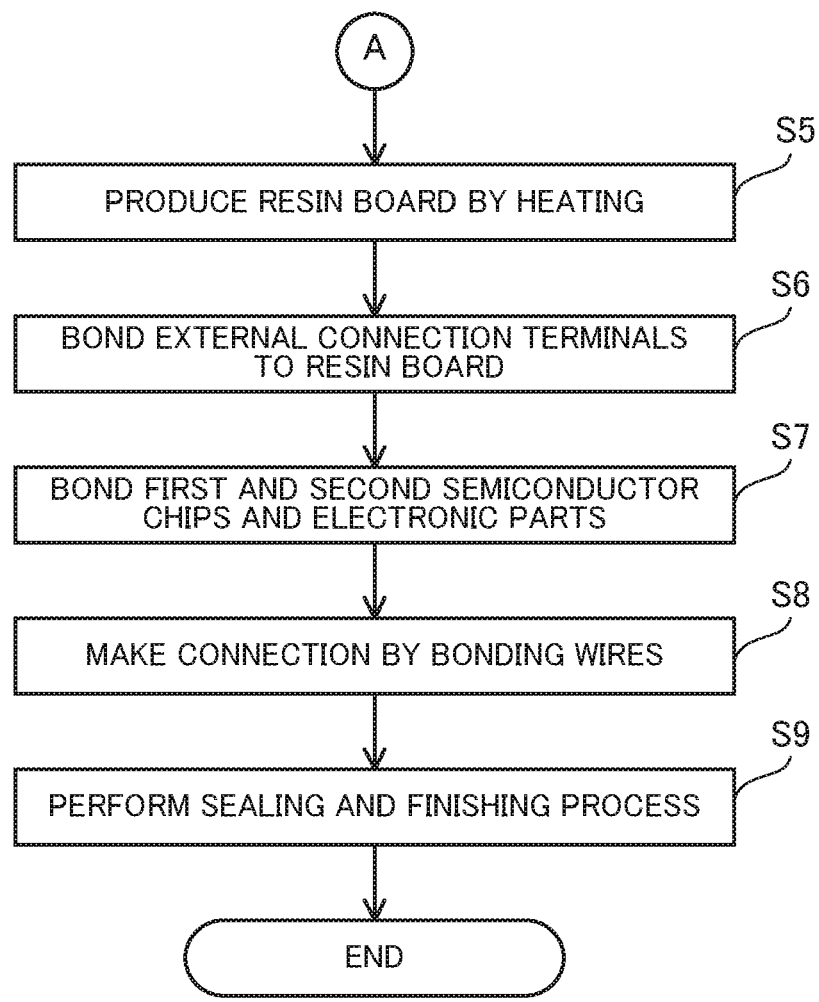
FIG. 5 is a flow chart illustrative of a method for manufacturing the semiconductor device according to the embodiment (part 2)
Figure 6:
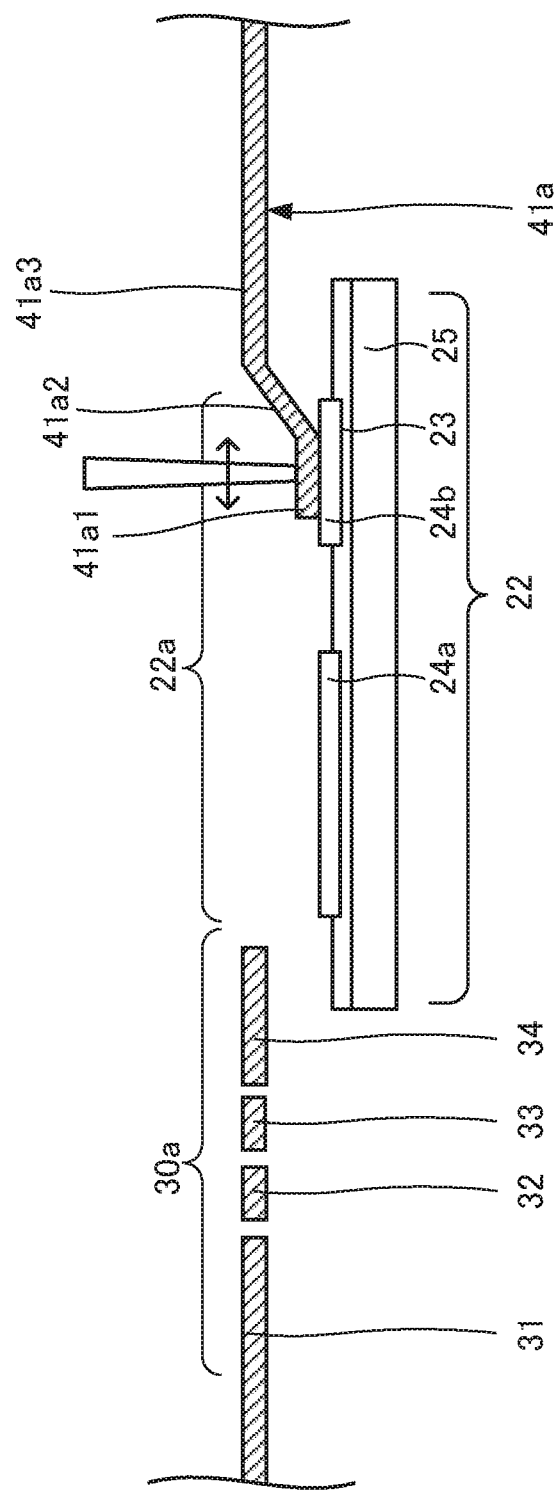
FIG. 6 is a view for describing a process for bonding external connection terminals included in the method for manufacturing the semiconductor device according to the embodiment.
Figure 7:
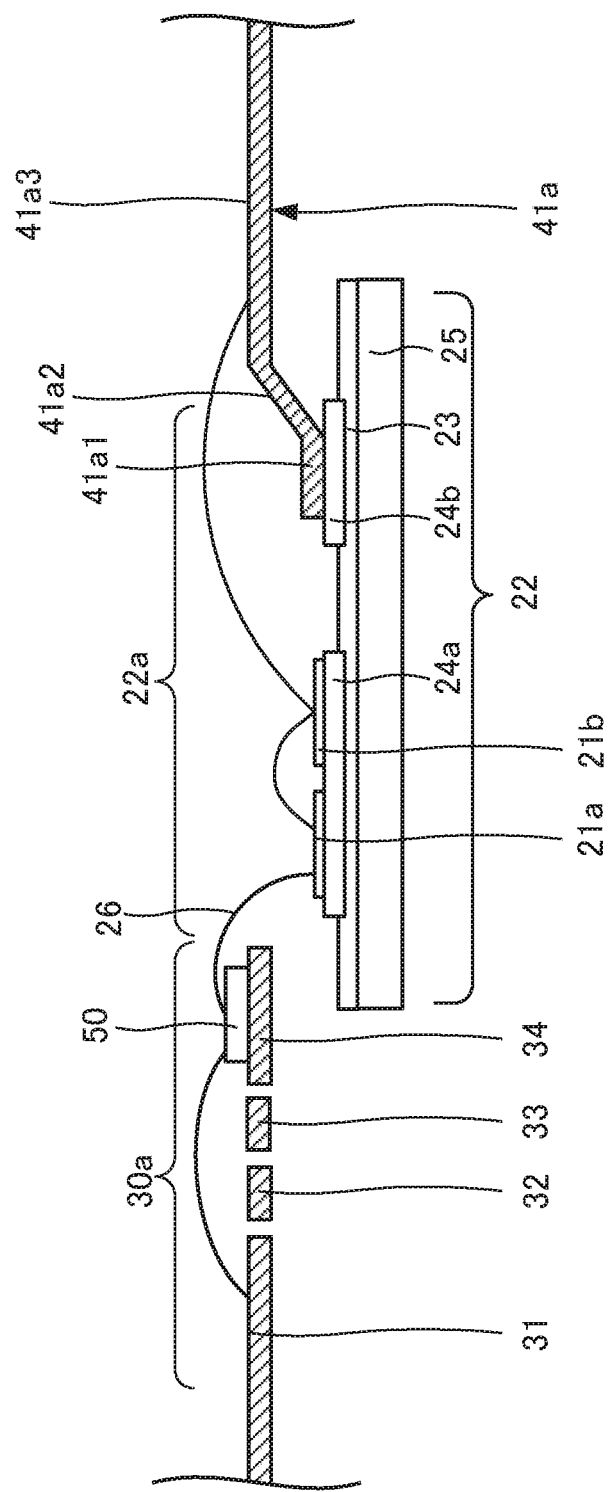
FIG. 7 is a view for describing a process for bonding semiconductor chips and electronic parts and a process for connecting by bonding wires included in the method for manufacturing the semiconductor device according to the embodiment.
Figure 8:
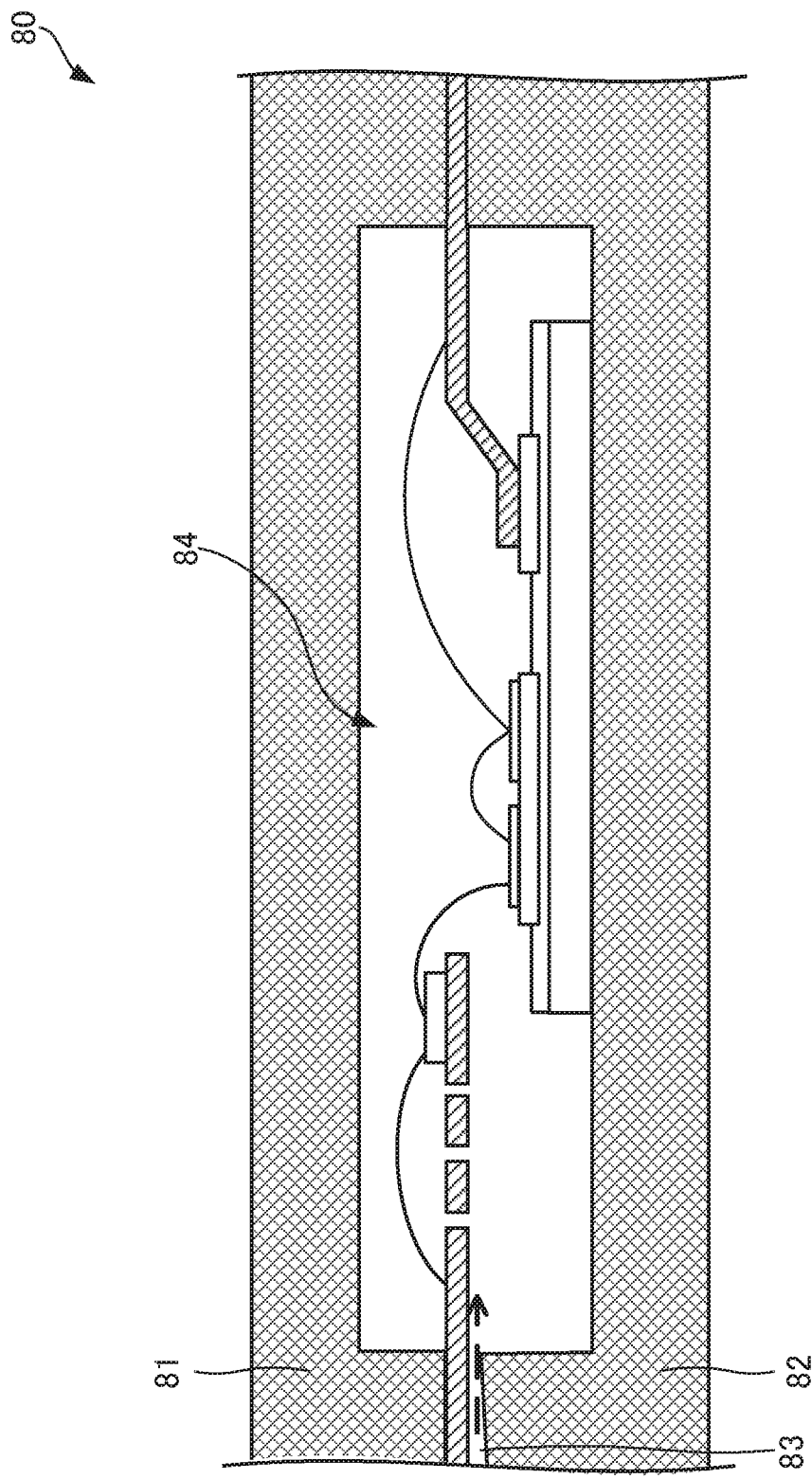
FIG. 8 is a view for describing a sealing process included in the method for manufacturing the semiconductor device according to the embodiment.

A method for manufacturing the above semiconductor device 10 will now be described by the use of FIGS. 4 through 8. FIGS. 4 and 5 are flow charts illustrative of a method for manufacturing the semiconductor device according to the embodiment. FIG. 6 is a view for describing a process for bonding the external connection terminals included in the method for manufacturing the semiconductor device according to the embodiment. FIG. 7 is a view for describing a process for bonding the semiconductor chips and the electronic parts and a process for connecting by the bonding wires included in the method for manufacturing the semiconductor device according to the embodiment. Furthermore, FIG. 8 is a view for describing a sealing process included in the method for manufacturing the semiconductor device according to the embodiment. FIGS. 6 through 8 are sectional views corresponding to the position of the dot-dash line X-X of FIG. 3.

First, components of the semiconductor device 10, such as a material for a resin board, metal patterns, the radiation plate 25, the first semiconductor chips 21a, the second semiconductor chips 21b, a lead frame (not illustrated) on which the plurality of control terminals 30 and the plurality of external connection terminals 40 are ranged by tie bars, and the electronic parts 50, are prepared (step S1). The metal patterns correspond to the circuit patterns 24. The metal patterns are cut from a metal plate and are formed. Furthermore, as described later, the metal patterns are formed by etching the metal plate located on a semi-cured board. Alternatively, the metal patterns are stamped out from a metal plate. The metal patterns stamped out from a metal plate have burrs and dull faces. At least one of the burrs and the dull faces may be removed at need by performing post-treatment on the metal patterns. Next, a semi-cured board in a semi-cured state is molded by the use of a material for a resin board (step S2). Furthermore, the details of step S2 (steps S2a through S2d) will now be described.

First, a liquid resin (A stage) which is a thermosetting resin and an inorganic filler mixed with the liquid resin are prepared (step S2a). The resin used in step S2a is phenolic resin, epoxy resin, melamine resin, or the like. Furthermore, the inorganic filler is a silica filler or the like as a mold-releasing agent. High fire retardance is kept by using a silica filler as the inorganic filler without mixing a halogen-based, antimony-based, or metal hydroxide-based fire retarder. Next, the liquid resin is mixed with the inorganic filler by 90 percent or more. The liquid resin mixed with the inorganic filler is heated to produce a semi-cured material (B stage) (step S2b). At this time heating time is properly set on the basis of takt time and depends on a catalyst species of the resin. For example, heating temperature is higher than or equal to 100° C. and lower than or equal to 200° C. Next, the semi-cured material in a semi-cured state is powdered (step S2c). Next, predetermined metal molds are filled with the powdered semi-cured material, press molding is performed, and the metal molds are separated. As a result, a semi-cured board in a semi-cured state having the shape of a flat plate is molded (step S2d). By doing so, the molding of a semi-cured board in a semi-cured state is completed. Steps S1 and S2 need be completed before the following step S3. The order of steps S1 and S2 may be reversed or steps S1 and S2 may be performed at the same time.

Next, the semi-cured board molded in this way is set on the radiation plate 25 (step S3). The size in plan view of the semi-cured board is approximately the same as the size in plan view of the radiation plate 25. Next, the metal patterns are laminated on the semi-cured board by punching and are pressed toward the radiation plate 25 with a predetermined press machine. As a result, a lower portion of each metal pattern is buried in the semi-cured board. The metal patterns are bonded in this way to the semi-cured board (step S4). The depth to which the metal patterns are buried in the semi-cured board changes according to pressing at this time. Next, the semi-cured board to which the metal patterns are bonded in this way, together with the radiation plate 25, is heated.

By doing so, the semi-cured board in which the metal patterns are buried is cured and the resin board 23 to which the circuit patterns 24 are adhered is produced (step S5). As a result, the insulated circuit board 22 including the radiation plate 25, the resin board 23, and the circuit patterns 24 is obtained. At this time, heating temperature is higher than or equal to 120° C. and lower than or equal to 180° C. Alternatively, postcure may be performed in a process after step S5 to completely cure the semi-cured board.

Next, the control wiring portion 34 of the control terminals 30 (control terminals 31, 32, and 33 are illustrated in FIG. 6) included in the lead frame is situated in the control region 30a. At the same time, the bonding portion 41a1 (bonding portions of the external connection terminals 41b, 41c, and 41d are not illustrated) of the external connection terminal 41a (same applies to the external connection terminals 41b, 41c, and 41d) included in the lead frame is situated on the circuit pattern 24b (same applies to the circuit patterns 24a, 24c, and 24d) of the insulated circuit board 22. At this time, a predetermined jig or the like (not illustrated) is used so that the control terminals 30 and the control wiring portion 34 will be in the control region 30a above the principal plane of the insulated circuit board 22. Furthermore, as illustrated in FIG. 6, ultrasonic bonding is performed (in an arrow direction) for bonding on the bonding portion 41a1 of the external connection terminal 41a included in the lead frame. The bonding portion 41a1 of the external connection terminal 41a is set on the circuit pattern 24b of the insulated circuit board 22. Similarly, ultrasonic bonding is performed for bonding on the external connection terminals 41b, 41c, and 41d included in the lead frame which are set on the circuit patterns 24a, 24c, and 24d, respectively, of the insulated circuit board 22 (step S6). For example, the ultrasonic bonding at this time is performed under the following conditions. A frequency is higher than or equal to 20 KHz and lower than or equal to 80 KHz. A bonding load is greater than or equal to 20 N and smaller than or equal to 150 N. Oscillation time is longer than or equal to 50 msec and shorter than or equal to 500 msec. As stated above, a lower portion of each circuit pattern 24 is buried in the resin board 23. Accordingly, even if ultrasonic bonding is performed on the circuit patterns 24a, 24b, 24c, and 24d on the resin board 23, the circuit patterns 24a, 24b, 24c, and 24d do not peel off the resin board 23 and reliably transmit ultrasonic vibration. As a result, the external connection terminals 40 are stably bonded.

Next, as illustrated in FIG. 7, the first semiconductor chips 21a and the second semiconductor chips 21b are bonded to the circuit pattern 24a with solder therebetween. Similarly, the first semiconductor chip 21a and the second semiconductor chip 21b are bonded to each of the circuit pattern 24b, 24c, and 24d with solder therebetween. Furthermore, the electronic parts 50 are bonded to the control wiring portion 34 with solder therebetween (step S7). Next, as illustrated in FIG. 7, the control terminals 30, the electronic parts 50, the first semiconductor chips 21a, the second semiconductor chips 21b, and the external connection terminals 40 (external connection terminal 41a in FIG. 7) are electrically connected properly by the bonding wires 26 (step S8).

Next, a structure formed in this way and illustrated in FIG. 7 is put between an upper metal mold 81 and a lower metal mold 82 of a molding die 80. As a result, as illustrated in FIG. 8, the insulated circuit board 22 and the plurality of control terminals 30 and the plurality of external connection terminals 40 of the lead frame are housed in a cavity 84 formed by the upper metal mold 81 and the lower metal mold 82. Furthermore, a material for the sealing member 60 is injected from a flow path 83 of the lower metal mold 82 to fill the inside of the cavity 84. By doing so, the insulated circuit board 22 and the plurality of control terminals 30 and the plurality of external connection terminals 40 of the lead frame are sealed with the sealing member 60. At this time, the insulated circuit board 22 is sealed in a state in which the insulated circuit board 22 is kept horizontal by the external connection terminals 41a, 41b, 41c, and 41d.

After molding, the upper metal mold 81 and the lower metal mold 82 are separated and the semiconductor device 10 is taken out. Finally, burrs of the sealing member 60 and needless portions, such as the tie bars of the lead frame and portions extending from the semiconductor device 10, are removed. As a result, the semiconductor device 10 illustrated in FIGS. 1 through 3 is obtained (step S9).

The resin board 23 to which the circuit patterns 24 are bonded which is produced in step S5 of the flow chart illustrative of the method for manufacturing the above semiconductor device will now be described by the use of FIGS. 9 through 13. FIGS. 9 through 13 are views for describing bonding the circuit patterns to the semi-cured board in a semi-cured state in the embodiment. FIGS. 9 through 13 illustrate the resin board 23 to which a circuit pattern 24 is bonded which corresponds to the sectional view of FIG. 2. Furthermore, FIGS. 9 through 13 illustrate only the resin board 23 to which the circuit pattern 24 is bonded. The radiation plate 25 is not illustrated.

Figure 9A:
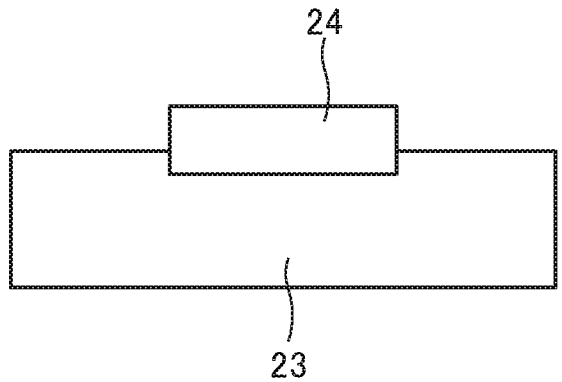
FIGS. 9A through 9C are views for describing bonding a circuit pattern to a semi-cured board in a semi-cured state in the embodiment (part 1)
Figure 9B:
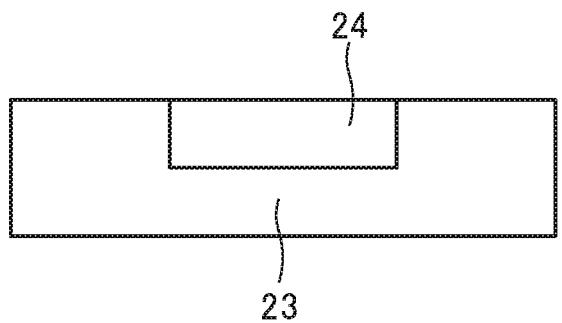
Figure 9C:
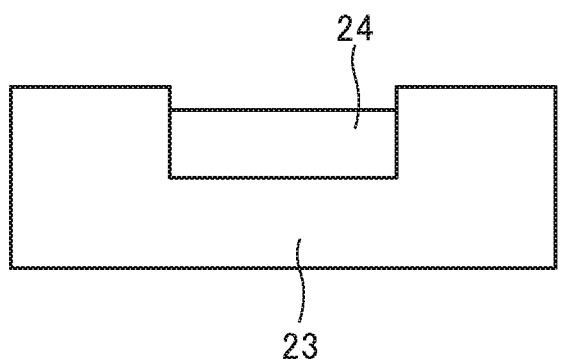

FIGS. 9A through 9C illustrate the resin board 23 to which the circuit pattern 24 is bonded. In step S1 of the above flow chart, a metal plate is cut and a metal pattern having a rectangular section is prepared. The metal pattern is bonded to the semi-cured board (step S4) and step S5 is performed. By doing so, the resin board 23 to which the circuit pattern 24 is bonded is obtained. In FIGS. 9A through 9C, the front surface of the circuit pattern 24 is exposed from the resin board 23 and the back surface of the circuit pattern 24 is buried in the resin board 23. That is to say, each of FIGS. 9A through 9C illustrates a case where the back surface of the circuit pattern 24 is situated below the front surface of the resin board 23. "Above" and "below" mean the direction from the back surface to the front surface of the resin board 23 and the direction from the front surface to the back surface of the resin board 23, respectively. Be distant from the back surface of the resin board 23 and be near to the front surface of the resin board 23 mean "above" and "below" respectively. In all of the cases illustrated in FIGS. 9A through 9C, side portions of the circuit pattern 24 are supported by the resin board 23.

This prevents the circuit patterns 24 from peeling off the resin board 23 when ultrasonic bonding is performed in step S6 of the above flow chart for bonding the external connection terminals 40 to the circuit patterns 24.

Ultrasonic vibration is reliably transmitted via the external connection terminals 40 to the circuit patterns 24 and the external connection terminals 40 are properly bonded to the circuit patterns 24.

Furthermore, FIG. 9A illustrates a case where the front surface of the circuit pattern 24 is situated above the front surface of the resin board 23. FIG. 9B illustrates a case where the front surface of the circuit pattern 24 and the front surface of the resin board 23 form the same plane. Furthermore, FIG. 9C illustrates a case where the front surface of the circuit pattern 24 is situated below the front surface of the resin board 23. In the case of FIG. 9A, the front surface of the circuit pattern 24 protrudes from the front surface of the resin board 23. Accordingly, when a wiring member is bonded to the circuit pattern 24 in a later process, a bonding tool easily enters and the external connection terminal 40 is easily bonded to the circuit pattern 24. In the cases of FIGS. 9B and 9C, on the other hand, the area of the side portions of the circuit pattern 24 which touch the resin board 23 is large, compared with the case of FIG. 9A. As a result, in the cases of FIGS. 9B and 9C, the external connection terminal 40 is reliably bonded to the circuit pattern 24, compared with the case of FIG. 9A.

In the cases of FIGS. 9B and 9C, however, a material for the semi-cured board may adhere to the front surface of the metal pattern when the metal pattern is bonded to the semi-cured board. If the resin board 23 is produced in a state in which a material for the semi-cured board may adhere to the front surface of the metal pattern, then the bonding area of the front surface of the circuit patterns 24 decreases. In addition, when the external connection terminal 40 is bonded to the circuit patterns in this state, an electrical failure may occur. Accordingly, in the cases of FIGS. 9B and 9C, a process for removing deposit on the front surface of the circuit patterns 24 is needed.

Furthermore, in the case of FIG. 9C, the front surface of the circuit pattern 24 is below the front surface of the resin board 23. If there is another circuit pattern 24 adjacent to the above circuit pattern 24, then the creepage distance between them is maintained. On the other hand, if the distance between the back surface of the circuit pattern 24 and the back surface of the resin board 23 is too short, then, for example, there is a possibility that insulation between the back surface of the resin board 23 and the radiation plate 25 is not kept. Therefore, there is need to properly set the distance between the front surface of the circuit pattern 24 and the front surface of the resin board 23 and the distance between the back surface of the circuit pattern 24 and the back surface of the resin board 23 so as to keep this insulation.

FIGS. 10A through 10D illustrate the resin board 23 to which the circuit pattern 24 having a rectangular section is bonded. This is the same with FIGS. 9A through 9C. However, FIGS. 10A through 10D illustrate the following cases. When the metal pattern is pressed against the semi-cured board in step S4, restraining convex portions which cover side portions of the metal pattern are formed. The resin board 23 to which the circuit pattern 24 is bonded in that state is produced. In all of the cases of FIGS. 10A through 10D, the front surface of the circuit pattern 24 is exposed from the resin board 23, the back surface of the circuit pattern 24 touches the resin board 23, and the side portions of the circuit pattern 24 are covered with restraining convex portions 23a and combined restraining convex portions 23b of the resin board 23. All of the side portions of the circuit patterns 24 may be covered with all of the restraining convex portions 23a and the combined restraining convex portions 23b of the resin board 23 in plan view or part of the side portions of the circuit patterns 24 may be covered with restraining convex portions 23a and combined restraining convex portions 23b of the resin board 23 in plan view. At least one pair of side portions opposite each other need be covered with restraining convex portions 23a and combined restraining convex portions 23b. Furthermore, the whole of each side portion may be covered with a restraining convex portion 23a or a combined restraining convex portion 23b from the back surface to the front surface of the circuit patterns 24 in sectional view or part of each side portion may be covered with a restraining convex portion 23a or a combined restraining convex portion 23b in sectional view. In this case, it is desirable that when ultrasonic bonding is performed in step S6 of the above flow chart for bonding the external connection terminals 40 to the circuit patterns 24, a pair of side portions be opposed to each other in a direction in which ultrasonic waves vibrate. A restraining convex portion 23a and a combined restraining convex portion 23b are situated in a direction in which ultrasonic waves vibrate. As a result, ultrasonic vibration is reliably transmitted and the external connection terminals 40 are properly bonded to the circuit patterns 24.

Figure 10A:
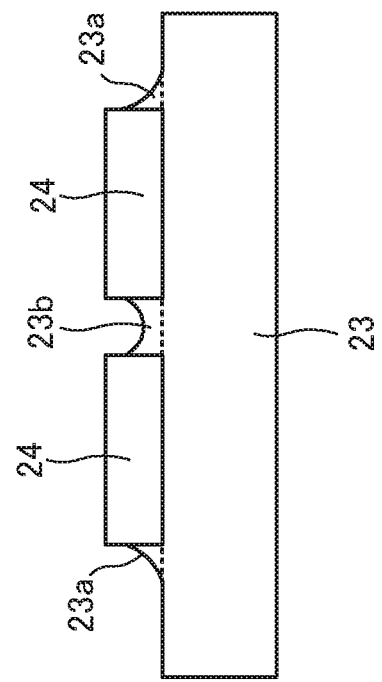
FIGS. 10A through 10D are views for describing bonding a circuit pattern to a semi-cured board in a semi-cured state in the embodiment (part 2)

In the case of FIG. 10A, the back surface of the circuit pattern 24 and the front surface of the resin board 23 form the same plane. Furthermore, side portions of the circuit pattern 24 are supported by restraining convex portions 23a. The case of FIG. 10B is the same with the case of FIG. 10A.

Figure 10B:
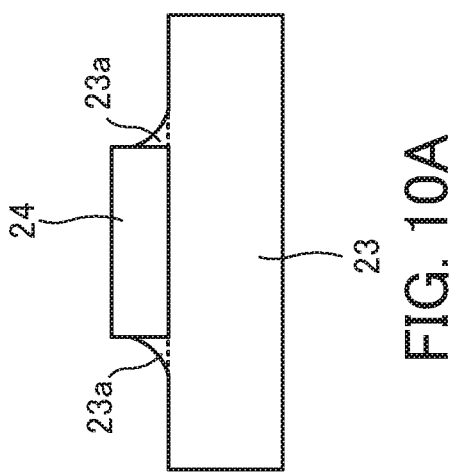
Figure 10C:
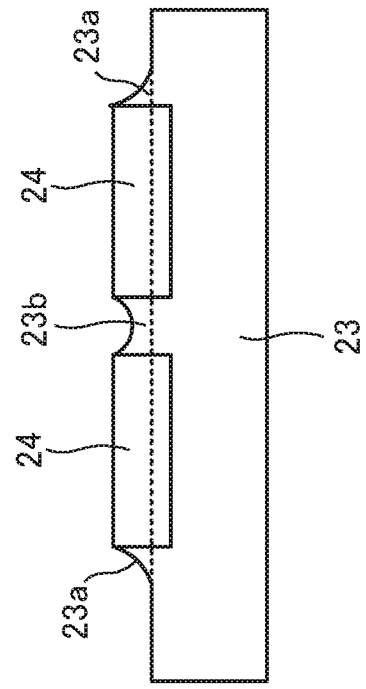

In the case of FIG. 10B, however, restraining convex portions in a gap between adjacent circuit patterns 24 combine together to form a combined restraining convex portion 23b. In the case of FIG. 10C, the back surface of the circuit pattern 24 is situated below the front surface of the resin board 23. Accordingly, in the case of FIG. 10C, the circuit pattern 24 is supported on the resin board 23 by the back surface situated below the front surface of the resin board 23 and side portions covered with restraining convex portions 23a.

Figure 10D:
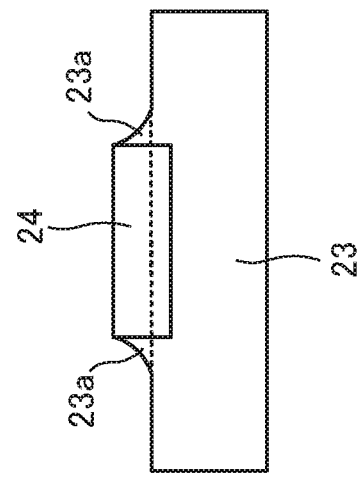

In the case of FIG. 10D, the back surfaces of the circuit patterns 24 are situated below the front surface of the resin board 23. Accordingly, in the case of FIG. 10D, each circuit pattern 24 is supported on the resin board 23 by a back surface situated below the front surface of the resin board 23 and side portions covered with a restraining convex portion 23a and a combined restraining convex portion 23b. "Above" and "below" mean the direction from the back surface to the front surface of the resin board 23 and the direction from the front surface to the back surface of the resin board 23, respectively. Be distant from the back surface of the resin board 23 and be near to the front surface of the resin board 23 mean "above" and "below" respectively.

The cases of FIG. 10 prevent the circuit patterns 24 from peeling off the resin board 23 when ultrasonic bonding is performed in step S6 of the above flow chart for bonding the external connection terminals 40 to the circuit patterns 24. This is the same with the cases of FIG. 9. Ultrasonic vibration is reliably transmitted via the external connection terminals 40 to the circuit patterns 24 and the external connection terminals 40 are properly bonded to the circuit patterns 24. Furthermore, in the cases of FIGS. 10C and 10D, the area of the side portions of the circuit pattern 24 which touch the resin board 23 is large, compared with the cases of FIGS. 10A and 10B. As a result, in the cases of FIGS. 10C and 10D, the external connection terminals 40 are reliably bonded to the circuit patterns 24, compared with the cases of FIGS. 10A and 10B.

FIGS. 11A through 11D illustrate the following cases. A metal pattern punched out from a metal plate in step S1 of the above flow chart is bonded to the semi-cured board (step S4) and step S5 is performed. By doing so, the resin board 23 to which the circuit pattern 24 is bonded is obtained. Protrusions (burrs 241) are formed on a pair of edge portions opposite each other of the back surface of the circuit pattern 24 and dull faces 242 having the shape of a curved surface are formed on edge portions opposite the burrs 241 of the front surface of the circuit pattern 24. Furthermore, the back surface of the circuit pattern 24 on which the burrs 241 are formed is placed on the front surface of the resin board 23. In this case, it is desirable that when ultrasonic bonding is performed in step S6 of the above flow chart for bonding the external connection terminals 40 to the circuit patterns 24, a pair of edge portions be opposed to each other in a direction in which ultrasonic waves vibrate.

In all of the cases of FIGS. 11A through 11D, the front surface of the circuit pattern 24 is exposed from the resin board 23, the back surface of the circuit pattern 24 touches the resin board 23, and the burrs 241 are buried in the resin board 23. That is to say, in the cases of FIGS. 11A through 11D, the burrs 241 of the circuit pattern 24 are situated below the front surface of the resin board 23. "Above" and "below" mean the direction from the back surface to the front surface of the resin board 23 and the direction from the front surface to the back surface of the resin board 23, respectively. Be distant from the back surface of the resin board 23 and be near to the front surface of the resin board 23 mean "above" and "below" respectively.

Figure 11A:
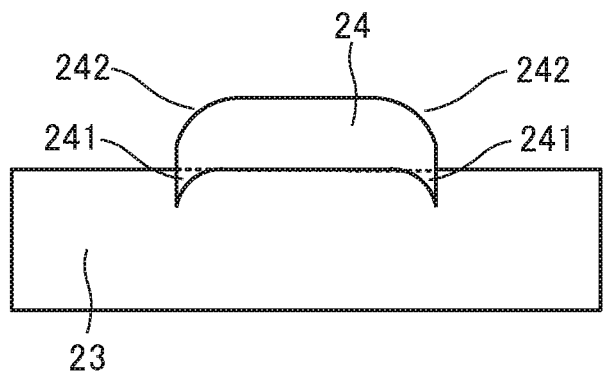
FIGS. 11A through 11D are views for describing bonding a circuit pattern to a semi-cured board in a semi-cured state in the embodiment (part 3)
Figure 11B:
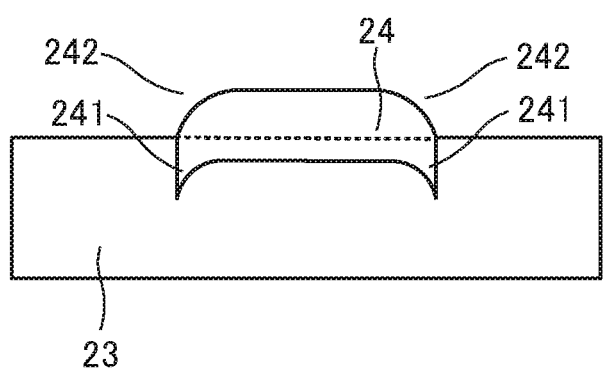
Figure 11C:
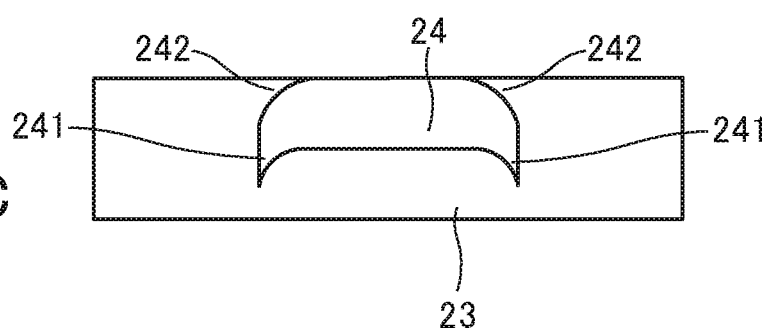

In the case of FIG. 11A, the back surface of the circuit pattern 24 and the front surface of the resin board 23 form the same plane and the burrs 241 of the circuit pattern 24 enter the front surface of the resin board 23. In the case of FIG. 11B, the back surface of the circuit pattern 24 is situated below the front surface of the resin board 23. In the case of FIG. 11C, the front surface of the circuit pattern 24 and the front surface of the resin board 23 form the same plane. Furthermore, in the case of FIG. 11D, the front surface of the circuit pattern 24 is situated below the front surface of the resin board 23. In addition, in the case of FIG. 11D, the dull faces 242 of the circuit pattern 24 are covered with the resin board 23 and the circuit pattern 24 is pressed by the resin board 23 to the central portion side. Accordingly, the circuit pattern 24 is firmly fixed into the resin board 23.

The cases of FIG. 11A through 11D prevent the circuit patterns 24 from peeling off the resin board 23 when ultrasonic bonding is performed in step S6 of the above flow chart for bonding the external connection terminals 40 to the circuit patterns 24. This is the same with the cases of FIGS. 9A through 9C. Ultrasonic vibration is reliably transmitted via the external connection terminals 40 to the circuit patterns 24 and the external connection terminals 40 are properly bonded to the circuit patterns 24. In particular, in the cases of FIGS. 11A through 11D, the burrs 241 of the circuit pattern 24 enter the resin board 23. As a result, the circuit patterns 24 is firmly bonded to the resin board 23, compared with the cases of FIGS. 9A through 9C and FIGS. 10A through 10D. Furthermore, in the cases of FIGS. 11A and 11B, the front surface of the circuit pattern 24 protrudes from the front surface of the resin board 23.

Figure 11D:
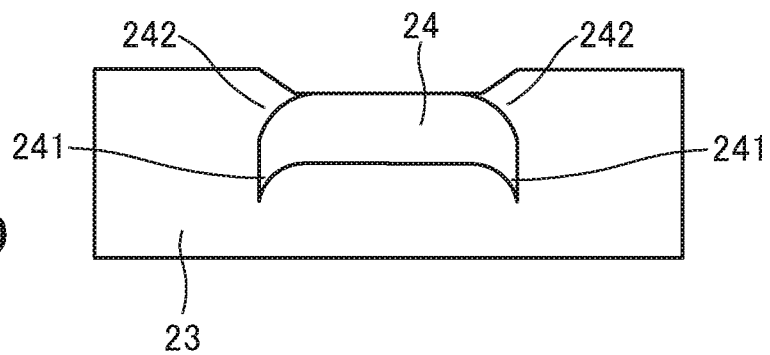

Accordingly, when a wiring member is bonded to the circuit pattern 24 in a later process, a bonding tool easily enters and the external connection terminal 40 is easily bonded to the circuit pattern 24. In the cases of FIGS. 11C and 11D, on the other hand, the area of side portions of the circuit pattern 24 which touch the resin board 23 is large, compared with the cases of FIGS. 11A and 11B. As a result, in the cases of FIGS. 11C and 11D, the external connection terminal 40 is reliably bonded to the circuit pattern 24, compared with the cases of FIGS. 11A and 11B.

FIGS. 12A through 12D illustrate the following cases. A metal pattern punched out from a metal plate in step S1 of the above flow chart is bonded to the semi-cured board (step S4) and step S5 is performed. By doing so, the resin board 23 to which the circuit pattern 24 is bonded is obtained. This is the same with the cases of FIGS. 11A through 11D. Protrusions (burrs 241) are formed on a pair of edge portions opposite each other of the back surface of the circuit pattern 24 and dull faces 242 on edge portions opposite the burrs 241 of the front surface of the circuit pattern 24 are removed. That is to say, the front surface of the circuit pattern 24 is an approximately flat surface. Furthermore, the back surface of the circuit pattern 24 on which the burrs 241 are formed is placed on the front surface of the resin board 23.

In all of the cases of FIGS. 12A through 12D, the front surface of the circuit pattern 24 is exposed from the resin board 23, the back surface of the circuit pattern 24 touches the resin board 23, and the burrs 241 are buried in the resin board 23. That is to say, in the cases of FIGS. 12A through 12D, the burrs 241 of the circuit pattern 24 are situated below the front surface of the resin board 23. "Above" and "below" mean the direction from the back surface to the front surface of the resin board 23 and the direction from the front surface to the back surface of the resin board 23, respectively. Be distant from the back surface of the resin board 23 and be near to the front surface of the resin board 23 mean "above" and "below" respectively.

Figure 12A:
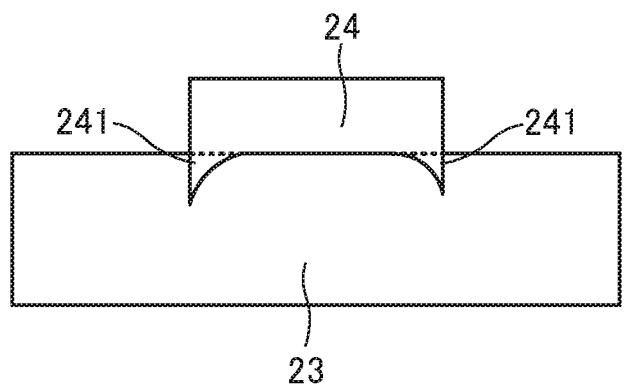
FIGS. 12A through 12D are views for describing bonding a circuit pattern to a semi-cured board in a semi-cured state in the embodiment (part 4)
Figure 12B:
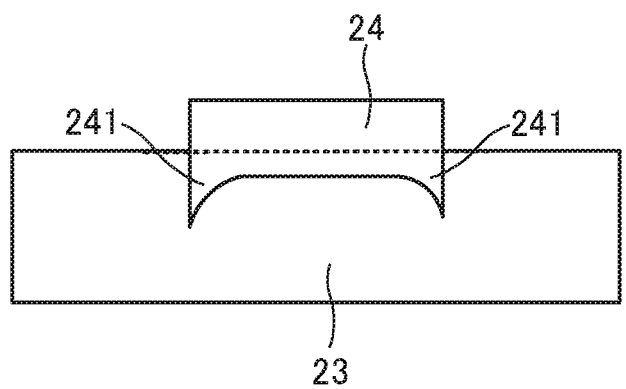
Figure 12C:
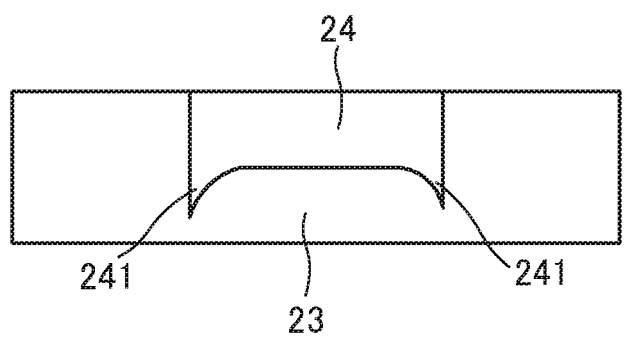

In the case of FIG. 12A, the back surface of the circuit pattern 24 and the front surface of the resin board 23 form the same plane and the burrs 241 of the circuit pattern 24 enter the front surface of the resin board 23. This is the same with the case of FIG. 11A. In the case of FIG. 12B, the back surface of the circuit pattern 24 is situated below the front surface of the resin board 23. This is the same with the case of FIG. 11B. In the case of FIG. 12C, the front surface of the circuit pattern 24 and the front surface of the resin board 23 form the same plane. Furthermore, in the case of FIG. 12D, the front surface of the circuit pattern 24 is situated below the front surface of the resin board 23.

Figure 12D:
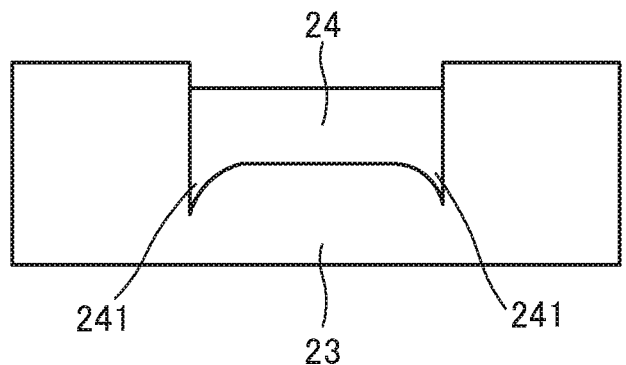

The cases of FIG. 12A through 12D prevent the circuit patterns 24 from peeling off the resin board 23 when ultrasonic bonding is performed in step S6 of the above flow chart for bonding the external connection terminals 40 to the circuit patterns 24. This is the same with the cases of FIGS. 9A through 9C. Ultrasonic vibration is reliably transmitted via the external connection terminals 40 to the circuit patterns 24 and the external connection terminals 40 are properly bonded to the circuit patterns 24. In particular, in the cases of FIGS. 12A through 12D, the burrs 241 of the circuit pattern 24 enter the resin board 23. As a result, the circuit patterns 24 is firmly bonded to the resin board 23, compared with the cases of FIGS. 9A through 9C and FIGS. 10A through 10D. Furthermore, in the cases of FIGS. 12A and 12B, the front surface of the circuit pattern 24 protrudes from the front surface of the resin board 23. Accordingly, when a wiring member is bonded to the circuit pattern 24 in a later process, a bonding tool easily enters and the external connection terminal 40 is easily bonded to the circuit pattern 24. In the cases of FIGS. 12C and 12D, on the other hand, the area of side portions of the circuit pattern 24 which touch the resin board 23 is large, compared with the cases of FIGS. 12A and 12B. As a result, in the cases of FIGS. 12C and 12D, the external connection terminal 40 is reliably bonded to the circuit pattern 24, compared with the cases of FIGS. 12A and 12B.

Figure 13A:
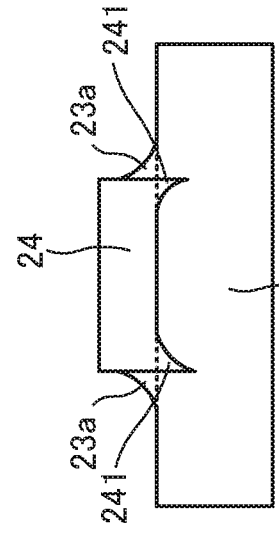
FIGS. 13A through 13D are views for describing bonding a circuit pattern to a semi-cured board in a semi-cured state in the embodiment (part 5)
Figure 13C:
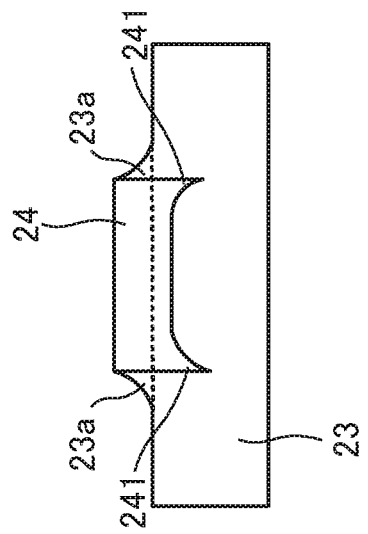
Figure 13B:
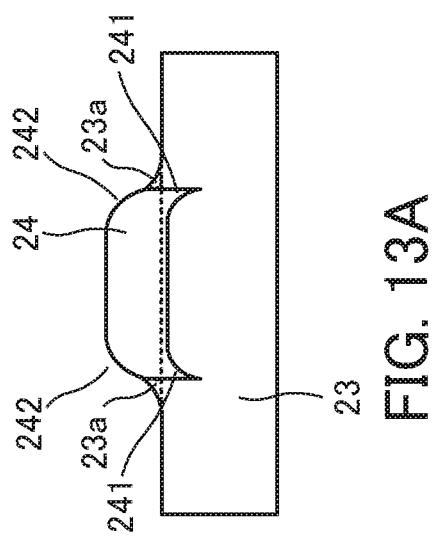
Figure 13D:
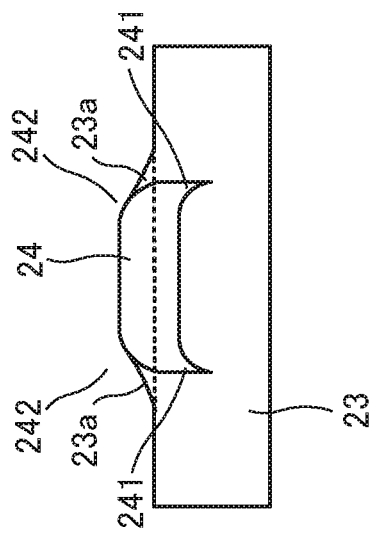

FIG. 13A through 13D are obtained by applying the circuit pattern 24 illustrated in FIG. 11 or 12 to FIG. 10A through 10D. That is to say, FIGS. 13A through 13D illustrate the following cases. A metal pattern punched out from a metal plate in step S1 of the above flow chart is bonded to the semi-cured board (step S4) and step S5 is performed. By doing so, the resin board 23 to which the circuit pattern 24 is bonded is obtained. In the case of FIG. 13A or 13C, burrs 241 having the shape of a protrusion are formed on a pair of edge portions opposite each other of the back surface of the circuit pattern 24 and dull faces 242 having the shape of a curved surface are formed on edge portions opposite the burrs 241 of the front surface of the circuit pattern 24. In the case of FIG. 13B or 13D, on the other hand, dull faces 242 on edge portions of the front surface of the circuit pattern 24 are removed and the front surface of the circuit pattern 24 is an approximately flat surface. Furthermore, the back surface of the circuit pattern 24 on which the burrs 241 are formed is placed on the front surface of the resin board 23.

In all of the cases of FIGS. 13A through 13D, the front surface of the circuit pattern 24 is exposed from the resin board 23, the back surface of the circuit pattern 24 touches the resin board 23, side portions of the circuit pattern 24 are covered with restraining convex portions 23a of the resin board 23, and the burrs 241 are buried in the resin board 23. That is to say, in the cases of FIGS. 13A through 13D, the burrs 241 of the circuit pattern 24 are situated below the front surface of the resin board 23.

In the case of FIG. 13A, the back surface of the circuit pattern 24 illustrated in FIG. 11a, 11B, 11D, or 11D and the front surface of the resin board 23 form the same plane and side portions of the circuit pattern 24 are supported by restraining convex portions 23a. In the case of FIG. 13B, the back surface of the circuit pattern 24 illustrated in FIG. 12a, 12B, 12D, or 12D and the front surface of the resin board 23 form the same plane and side portions of the circuit pattern 24 are supported by restraining convex portions 23a. In the case of FIG. 13C, the back surface of the circuit pattern 24 is situated below the front surface of the resin board 23. In the case of FIG. 13D, the back surface of the circuit pattern 24 is situated below the front surface of the resin board 23.

The cases of FIG. 13A through 13D prevent the circuit patterns 24 from peeling off the resin board 23 when ultrasonic bonding is performed in step S6 of the above flow chart for bonding the external connection terminals 40 to the circuit patterns 24. This is the same with the cases of FIGS. 9A through 9C. Ultrasonic vibration is reliably transmitted via the external connection terminals 40 to the circuit patterns 24 and the external connection terminals 40 are properly bonded to the circuit patterns 24. In particular, in the cases of FIGS. 13A through 13D, the burrs 241 of the circuit pattern 24 enter the resin board 23. As a result, the circuit patterns 24 is firmly bonded to the resin board 23, compared with the cases of FIGS. 9A through 9C and FIGS. 10A through 10D. Furthermore, in the cases of FIGS. 13C and 13D, the area of side portions of the circuit pattern 24 which touch the resin board 23 is large, compared with the cases of FIGS. 13A and 13B. As a result, in the cases of FIGS. 13C and 13D, the external connection terminal 40 is reliably bonded to the circuit pattern 24, compared with the cases of FIGS. 13A and 13B. In addition, In the case of FIG. 13C, on the other hand, the dull faces 242 of the circuit pattern 24 are covered with the resin board 23 and the external connection terminal 40 is reliably bonded to the circuit pattern 24, compared with the cases of FIGS. 13A, 13B, 13D.

Figure 14:
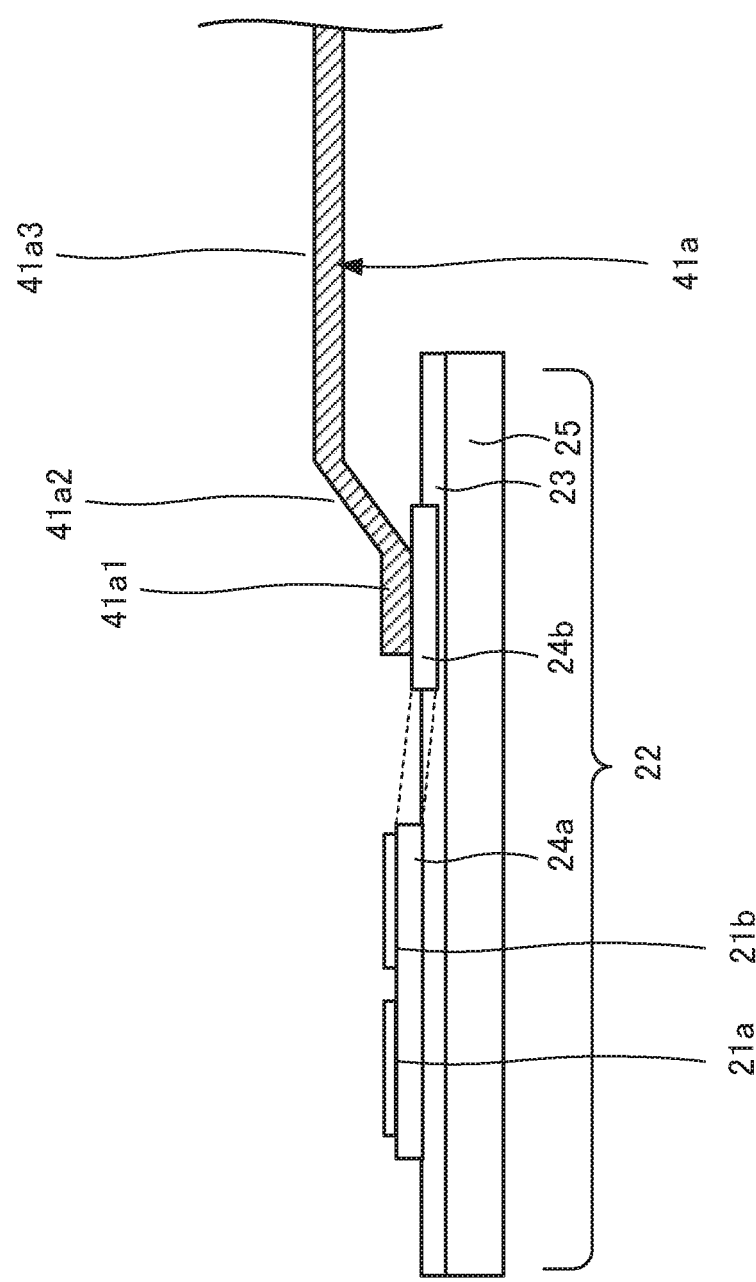
FIG. 14 illustrates another insulated circuit board of the semiconductor device according to the embodiment (part 1)
Figure 15:
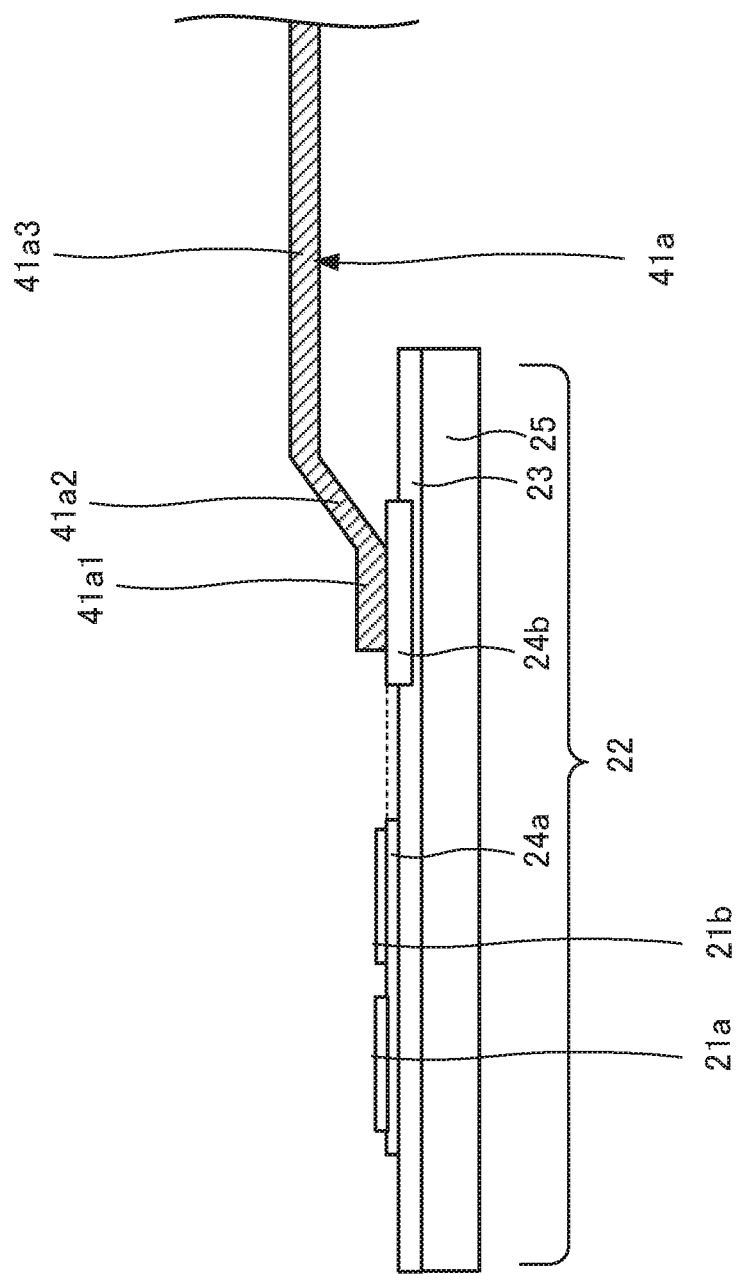
FIG. 15 illustrates another insulated circuit board of the semiconductor device according to the embodiment (part 2).

It is desirable that at least the circuit patterns 24, of the circuit patterns 24 formed in this way over the insulated circuit board 22 of the semiconductor device 10, to which the external connection terminal 40 are bonded by ultrasonic bonding be bonded to the resin board 23 and that at least a pair of sides opposite each other of each circuit pattern 24 be supported. Another example of the insulated circuit board 22 will be described by the use of FIG. 14 or 15. Each of FIG. 14 and FIG. 15 illustrates another insulated circuit board included in the semiconductor device according to the embodiment. Each of FIG. 14 and FIG. 15 illustrates an insulated circuit board 22 and an external connection terminal 41a included in the semiconductor device 10.

As illustrated in FIG. 14, for example, circuit patterns 24a and 24b which are approximately equal in thickness are fixed to the resin board 23. The circuit pattern 24b, of the circuit patterns 24a and 24b, to which the external connection terminal 41a is bonded is bonded to the resin board 23 and a pair of sides of the circuit pattern 24b are supported. On the other hand, the back surface of the circuit pattern 24a to which a first semiconductor chip 21a and a second semiconductor chip 21b are bonded is adhered to the front surface of the resin board 23 and the back surface of the circuit pattern 24a and the front surface the resin board 23 form approximately the same surface. Sides of the circuit pattern 24a are not supported. In this case, the front surface of the circuit pattern 24b is situated below the front surface of the circuit pattern 24a. Furthermore, the back surface of the circuit pattern 24b is situated below the back surface of the circuit pattern 24a. That is to say, the resin board 23 under the circuit pattern 24a is thick. This relaxes stress created by heat generated by the first semiconductor chip 21a and the second semiconductor chip 21b.

In addition, as illustrated in FIG. 15, circuit patterns 24a and 24b which differ in thickness are fixed to the resin board 23. The circuit pattern 24a is worked so as to become thinner than the circuit pattern 24b. The circuit pattern 24b, of the circuit patterns 24a and 24b, to which the external connection terminal 41a is bonded is the resin board 23 and a pair of sides of the circuit pattern 24b are supported. On the other hand, the back surface of the circuit pattern 24a to which a first semiconductor chip 21a and a second semiconductor chip 21b are bonded is adhered to the front surface of the resin board 23 and the back surface of the circuit pattern 24a and the front surface the resin board 23 form approximately the same surface. Sides of the circuit pattern 24a are not supported. In this case, the front surface of the circuit pattern 24b and the front surface of the circuit pattern 24a are approximately flush with each other. Furthermore, the back surface of the circuit pattern 24b is situated below the back surface of the circuit pattern 24a. That is to say, the resin board 23 under the circuit pattern 24a is thick. This relaxes stress created by heat generated by the first semiconductor chip 21a and the second semiconductor chip 21b.

The above semiconductor device 10 has the insulated circuit board 22 including the radiation plate 25 with a front surface, the resin board 23 with a back surface adhered to the front surface of the radiation plate 25 and a front surface containing resin, and the circuit pattern 24 with a back surface adhered to the front surface of the resin board 23 and a front surface. The semiconductor device 10 has at least one of the first and second semiconductor chips 21a and 21b bonded to the front surface of the circuit pattern 24 and the external connection terminal 40. At least a pair of side portions opposite each other of the circuit pattern 24 are supported by the resin board 23. In this case, it is desirable that when ultrasonic bonding is performed in step S6 of the above flow chart for bonding the external connection terminals 40 to the circuit patterns 24, the pair of side portions be opposed to each other in a direction in which ultrasonic waves vibrate. With the above semiconductor device 10, the circuit patterns 24 are supported on the resin board 23 when ultrasonic bonding is performed for bonding the external connection terminals 40 to the circuit patterns 24. As a result, the circuit patterns 24 do not peel off the resin board 23. Accordingly, ultrasonic waves are transmitted from the external connection terminals 40 to the circuit patterns 24 and the external connection terminals 40 are reliably bonded to the circuit patterns 24. In addition, the external connection terminals 40 are directly bonded in this way to the circuit patterns 24. As a result, electrical resistance is low compared with a case where the external connection terminals 40 are bonded to the circuit patterns 24 with bonding wires. Furthermore, the semiconductor device 10 uses the insulated circuit board 22. Accordingly, the semiconductor device 10 efficiently dissipates from the radiation plate 25 heat generated by the first and second semiconductor chips 21a and 21b and a rise in temperature is suppressed. In addition, the control region 30a in which the control wiring portion 34 included in the control terminals 30 is located is situated above the element region 22a of the insulated circuit board 22. This suppresses the influence of noise generated in each region. As a result, the semiconductor device 10 is stably driven. Therefore, the characteristics of the semiconductor device 10 are improved. In addition, the semiconductor device 10 does not use a case with which the control terminals 30, the external connection terminals 40, and the like are integrally molded. As a result, a process for molding such a case or a process for bonding the insulated circuit board 22 to a case is not needed. This simplifies a process for manufacturing the semiconductor device 10 and reduces the manufacturing costs.

According to the disclosed technique, manufacturing costs are reduced and characteristics are improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   an insulated circuit board, having
      a radiation plate having a front surface,
      a resin board having a front surface and a back surface that is adhered to the front surface of the radiation plate, the resin board containing a resin, and
      a circuit pattern having a front surface and a back surface that is adhered to the front surface of the resin board;
   a wiring member; and
   at least one semiconductor chip, bonded to the front surface of the circuit pattern or electrically connected to the wiring member, wherein
   the circuit pattern has at least one pair of side portions opposite to each other that are supported by the resin board,
   the resin board has a plurality of restraining convex portions, each of which is a protrusion, formed on the front surface thereof, and
   the side portions of the circuit pattern are supported by the plurality of restraining convex portions.

2. The semiconductor device according to claim 1, wherein the wiring member is bonded to the front surface of the circuit pattern.

3. The semiconductor device according to claim 1, wherein:
   the back surface of the circuit pattern is situated below the front surface of the resin board; and
   the circuit pattern is bonded to the resin board.

4. The semiconductor device according to claim 3, wherein:
   the front surface of the circuit pattern is flush with or below the front surface of the resin board; and
   the circuit pattern is bonded to the resin board.

5. The semiconductor device according to claim 1, wherein
   the circuit pattern includes at least two circuit patterns formed with a gap therebetween; and
   the plurality of restraining convex portions includes restraining convex portions located in the gap that combine together to form a combined restraining convex portion.

6. The semiconductor device according to claim 1, wherein
the back surface of the circuit pattern has a pair of first edge portions opposite to each other, each of which has a protrusion that enters the front surface of the resin board.

7. The semiconductor device according to claim 6, wherein
the front surface of the circuit pattern has a pair of second edge portions opposite to each other, each of which has a dull face having a shape of a curved surface, the dull faces being respectively opposite to the protrusions on the back surface of the circuit pattern.

8. The semiconductor device according to claim 1, wherein the resin is a phenolic resin, an epoxy resin, or a melamine resin.

9. The semiconductor device according to claim 1, wherein the wiring member is a lead frame, a bonding ribbon, or a bonding wire.

10. The semiconductor device according to claim 1, wherein the wiring member is bonded to the circuit pattern by ultrasonic bonding.

11. A semiconductor device manufacturing method comprising:
a preparation process of preparing a radiation plate, a circuit pattern, and a wiring member;
a semi-cured board molding process of molding a semi-cured board in a semi-cured state containing a thermosetting resin;
a resin board producing process of
placing the semi-cured board on a front surface of the radiation plate,
placing the circuit pattern on a front surface of the semi-cured board, and
heating and curing the semi-cured board while pressing the circuit pattern toward the front surface of the radiation plate,
thereby producing a resin board to which the circuit pattern is adhered, the resin board having a plurality of restraining convex portions, each of which is a protrusion, formed on the front surface thereof, so that at least a pair of side portions of the circuit pattern that are opposite to each other are supported by the plurality of restraining convex portions; and
a bonding process of bonding the wiring member to a front surface of the circuit pattern.

12. The semiconductor device manufacturing method according to claim 11, wherein in the bonding process, the wiring member is bonded to the front surface of the circuit pattern by ultrasonic bonding.

13. The semiconductor device manufacturing method according to claim 11, wherein the semi-cured board molding process includes a process of
mixing a liquid thermosetting resin and a powdered inorganic filler, and
performing heating to form a powdered semi-cured material.

14. The semiconductor device manufacturing method according to claim 13, wherein the semi-cured board molding process further includes a process of
filling a metal mold with the powdered semi-cured material, and
pressing the powdered semi-cured material in the metal mold to mold the semi-cured board.

15. A semiconductor device, comprising:
an insulated circuit board, having
a radiation plate having a front surface,
a resin board having a front surface and a back surface that is adhered to the front surface of the radiation plate, the resin board containing a resin, and
a circuit pattern having a front surface and a back surface that is adhered to the front surface of the resin board;
a wiring member; and
at least one semiconductor chip, bonded to the front surface of the circuit pattern or electrically connected to the wiring member, wherein
the circuit pattern has at least one pair of side portions opposite to each other that are supported by the resin board, and
the back surface of the circuit pattern has a pair of first edge portions opposite to each other, each of which has a protrusion that enters the front surface of the resin board.

* * * * *